United States Patent
Lin et al.

(10) Patent No.: US 8,174,074 B2
(45) Date of Patent: May 8, 2012

(54) ASYMMETRIC EMBEDDED SILICON GERMANIUM FIELD EFFECT TRANSISTOR

(75) Inventors: Chung-Hsun Lin, White Plains, NY (US); Isaac Lauer, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 33 days.

(21) Appl. No.: 12/551,804

(22) Filed: Sep. 1, 2009

(65) Prior Publication Data

US 2011/0049626 A1    Mar. 3, 2011

(51) Int. Cl.
*H01L 27/12* (2006.01)

(52) U.S. Cl. ......... 257/347; 257/E21.415; 257/E29.286; 438/151; 438/369; 438/370; 438/373; 438/423; 438/440; 438/450; 438/506; 438/527; 438/537; 438/766

(58) Field of Classification Search .............. 257/347, 257/E21.415, E29.286; 438/151
See application file for complete search history.

(56) References Cited

U.S. PATENT DOCUMENTS

| | | | |
|---|---|---|---|
| 6,642,566 B1 | 11/2003 | Mandelman et al. | |
| 6,660,581 B1 | 12/2003 | Yang et al. | |
| 6,661,049 B2 | 12/2003 | Tzeng et al. | |
| 6,686,248 B1* | 2/2004 | Yu | 438/303 |
| 6,790,750 B1* | 9/2004 | Long et al. | 438/517 |
| 7,145,196 B2 | 12/2006 | Hur et al. | |
| 7,309,660 B2 | 12/2007 | Chen | |
| 7,368,358 B2 | 5/2008 | Ouyang et al. | |
| 7,723,174 B2 | 5/2010 | Waite et al. | |
| 2004/0173847 A1 | 9/2004 | Adkisson et al. | |
| 2006/0086987 A1 | 4/2006 | Chen et al. | |
| 2006/0099745 A1 | 5/2006 | Hsu et al. | |
| 2007/0018252 A1 | 1/2007 | Zhu | |
| 2007/0122955 A1 | 5/2007 | Luo et al. | |
| 2007/0138592 A1 | 6/2007 | Chang et al. | |
| 2007/0181977 A1 | 8/2007 | Lochtefeld et al. | |
| 2007/0202641 A1* | 8/2007 | Wei et al. | 438/194 |
| 2008/0122011 A1 | 5/2008 | Wu | |
| 2008/0124874 A1* | 5/2008 | Park et al. | 438/285 |
| 2009/0093095 A1 | 4/2009 | Obradovic et al. | |
| 2009/0258463 A1 | 10/2009 | Kim et al. | |
| 2010/0155727 A1 | 6/2010 | Mowry et al. | |

(Continued)

OTHER PUBLICATIONS

Of Hsiao et al. ("Source/Drain Engineering with Ge Large Angle Tilt Implantation and Pre-Amorphization to Improve Current Drive and Alleviate Floating Body Effects of Thin Film SOI MOSFET", Proceeding of the 27th European Solid State Device Research Conference, pp. 516-519, 1997).*

(Continued)

*Primary Examiner* — Alexander Ghyka
*Assistant Examiner* — Yasser Abdelaziez
(74) *Attorney, Agent, or Firm* — Jose Gutman; Fleit Gibbons Gutman Bongini & Bianco PL

(57) ABSTRACT

A semiconductor device, an integrated circuit, and method for fabricating the same are disclosed. The semiconductor device includes a gate stack formed on an active region of a silicon-on-insulator substrate. A gate spacer is formed over the gate stack. A source region that includes embedded silicon germanium is formed within the semiconductor layer. A drain region that includes embedded silicon germanium is formed within the semiconductor layer. The source region includes an angled implantation region that extends into the embedded silicon germanium of the source region, and is asymmetric relative to the drain region.

19 Claims, 9 Drawing Sheets

U.S. PATENT DOCUMENTS

2010/0224938 A1    9/2010    Zhu

OTHER PUBLICATIONS

U.S. Appl. No. 12/551,941, entitled "Embedded Silicon Germanium N-Type Filed Effect Transistor for Reduced Floating Body Effect,", Inventors: Leland Chang, et al. filed Sep. 1, 2009.

Zhang, D., et al., "Characteristic Study of SOI SGe Technology", Proceedings 2007 IEEE International SOI Conference, Oct. 1-4, 2007, Indian Wells, California, pp. 21-22; ISBM: 1-4244-0879-2; Material Identity Number: YXA7-1900-173.

Ang, K.W., et al., "Strained N-Channel Transistors with Silicon Source and Drain Regions and Embedded Silicon-Germanium as Strain-Transfer Structure", IEEE Electron Device Letters, vol. 28, pp. 609-612, 2007.

Ang, K.W., et al., "Beneath-The-Channel Strain-Transfer-Structure (STS) and En Source/Drain Stressors for Strain and Performance Enhancement Nanoscale MOSFETs," 2007 IEEE Symposium on VLSI Technology, pp. 42-43, Jun. 12-14, 2007, Kyoto, Japan; ISBM: 978-4-900784-03-1; Material Identify Number: YXA*-1900-151.

Wang, G.H., et al., "Uniaxial Strained Silicon n-FETs on Silicon-Germanium-on-Insulator Substrates with an e-SiGe Stress Transfer Layer and Source/Drain Stressors for Performance Enhancement", Proceedings of the 37$^{th}$ European Solid-State Device Research Conference, pp. 311-314; Sep. 11-13, 2007; Munich, Germany, ISBM: 978-1-4244-1123-8; Material Identity Number: YXA*-1900-206.

Donaton, R.A., et al., "Design and Fabrication of MOSFETs with a Reverse Embedded SiGe (Rev. eSiGe) Structure", 2006 International Electron Device Meeting (IEEE Cat. No. 06CH37807C); Dec. 11-13, 2006; Washington, D.C., ISBM: 142440438X; Material Identity Number: XX-2007-00720.

Non-Final Rejection for U.S. Appl. No. 12/551,941 dated Jul. 18, 2011.

Final Rejection dated Dec. 7, 2011 for U.S. Appl. No. 12/551,941.

* cited by examiner

ASYMMETRIC EMBEDDED SILICON GERMANIUM FIELD EFFECT TRANSISTOR

FIELD OF THE INVENTION

The present invention generally relates to the field of semiconductors, and more particularly relates to embedded silicon germanium p-type field effect transistors.

BACKGROUND OF THE INVENTION

The use of asymmetric devices in Silicon-On-Insulator (SOI) technologies is now widespread in the industry. However, embedded silicon germanium (eSiGe) PFETs experience lower floating body effects. The floating body effect is specific to transistors formed on substrates having an insulator layer. In particular, the neutral floating body is electrically isolated by source/drain and halo extension regions that form oppositely poled diode junctions at the ends of the transistor conduction channel and floating body, while the gate electrode is insulated from the conduction channel through a dielectric. The insulator layer in the substrate completes insulation of the conduction channel and thus prevents discharge of any charge that may develop in the floating body. Charge injection into the neutral body when the transistor is not conducting develops voltages in the conduction channel in accordance with the source and drain diode characteristics. The floating body effect is induced by the excess carriers generated by hot electrons near the gradient drain region, resulting in the enhancement in the body potential in SOI devices. It induces a threshold voltage reduction, resulting in a kink in output characteristics. The voltage developed due to charge collection in the transistor conduction channel has the effect of altering the switching threshold of the transistor. This effect, in turn, alters the signal timing and signal propagation speed, since any transistor will have a finite slew rate and the rise and fall time of signals is not instantaneous even when gate capacitance is very small. SOI switching circuits, in particular, suffer from severe dynamic floating body effects such as hysteresis and history effects. The onset of the kink effect in SOI switching circuits strongly depends on operating frequency, and produces Lorentzian-like noise overshoot and harmonic distortion. Therefore, the direct current performance advantage for a PFET with asymmetric halos is reduced to zero.

SUMMARY OF THE INVENTION

In one embodiment, a method for fabricating a semiconductor device is disclosed. The method includes forming a gate stack on an active region of a silicon-on-insulator substrate. A gate spacer is formed over the gate stack. A first trench is formed in a first portion of a semiconductor layer including the active region extending away from a first side of the gate spacer. A second trench is formed in a second portion of the semiconductor layer extending away from a second side of the gate spacer. Silicon germanium is epitaxially grown within the first trench and the second trench. An amorphizing species is asymmetrically implanted within the silicon germanium grown in the first trench including a source region and which is asymmetrical relative to the second trench including a drain region.

In another embodiment, a semiconductor device is disclosed. The semiconductor device includes a gate stack formed on an active region of a silicon-on-insulator substrate. A gate spacer is formed over the gate stack. A source region that includes embedded silicon germanium is formed within the semiconductor layer. A drain region is formed within the semiconductor layer including embedded silicon germanium. The source region includes an angled implantation region that extends into the embedded silicon germanium and is asymmetric relative to the drain region.

In yet another embodiment, an integrated circuit is disclosed. The integrated circuit includes a circuit supporting substrate and a plurality of semiconductor devices disposed thereon. Each semiconductor device includes a gate stack formed on an active region of a silicon-on-insulator substrate. A gate spacer is formed over the gate stack. A source region that includes embedded silicon germanium is formed within the semiconductor layer. A drain region is formed within the semiconductor layer including embedded silicon germanium. The source region includes an angled implantation region that extends into the embedded silicon germanium and is asymmetric relative to the drain region.

DETAILED DESCRIPTION

As required, detailed embodiments of the present invention are disclosed herein; however, it is to be understood that the disclosed embodiments are merely examples of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure and function. Further, the terms and phrases used herein are not intended to be limiting; but rather, to provide an understandable description of the invention.

The terms "a" or "an", as used herein, are defined as one or more than one. The term plurality, as used herein, is defined as two or more than two. The term another, as used herein, is defined as at least a second or more. In general, unless otherwise indicated, singular elements may be in the plural and vice versa with no loss of generality. The terms including and/or having, as used herein, are defined as including (i.e., open language). The term coupled, as used herein, is defined as connected, although not necessarily directly, and not necessarily mechanically.

Various embodiments of the present invention create an eSiGe PFET with a reduced floating body effect. In particular, various embodiments create an asymmetric eSiGe PFET. During fabrication of the asymmetric eSiGe PFET an asymmetric implant of an amorphizing species is performed to amorphize the source to body sidewall of the FET. This increases the body to source leakage, which in turn reduces the floating body effect.

Figure 1:
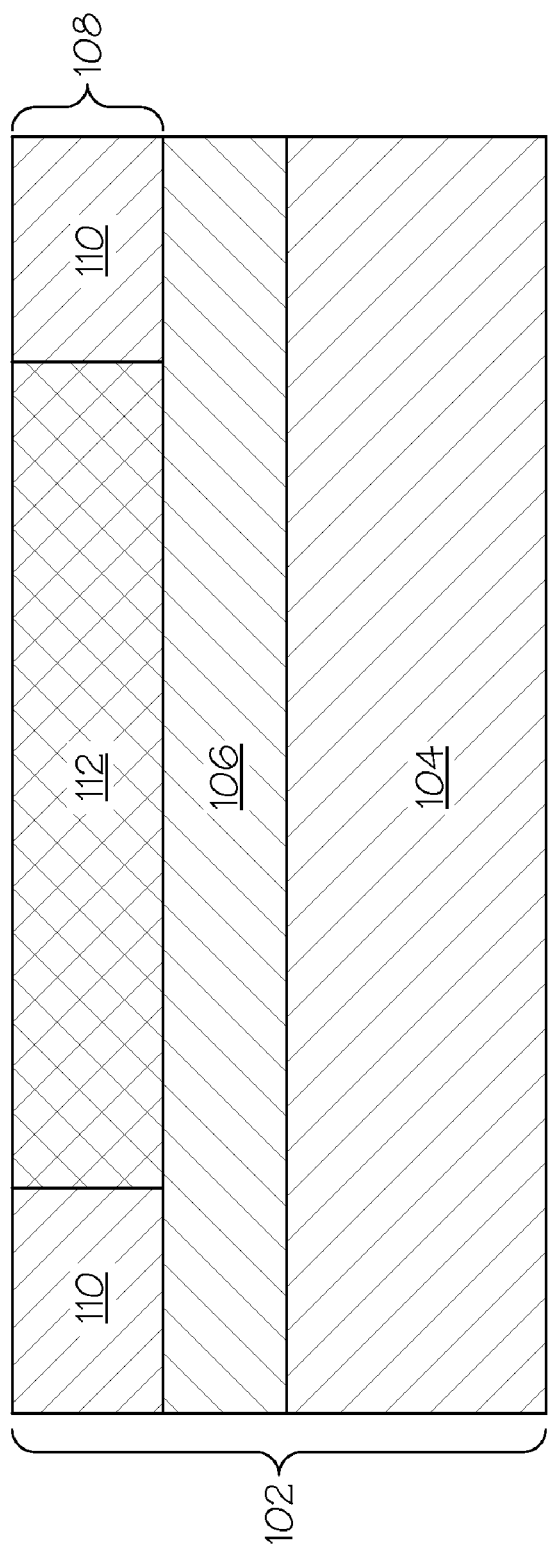
FIGS. 1-6 are cross-sectional views showing various fabrication processes of an asymmetric eSiGe PFET according to one embodiment of the present invention.

FIGS. 1-8 show fabrication of an asymmetric eSiGe PFET according to one or more embodiments of the present invention. As shown in FIG. 1, an SOI substrate 102 is provided. The SOI substrate 102 is formed by a handle substrate 104 (e.g., a silicon substrate), an overlying buried insulator layer 106 (e.g., an oxide layer), and an overlying semiconductor layer 108. Shallow trench isolation regions 110 of a dielectric material are formed in the semiconductor layer 108. The shallow trench isolation region 110 abuts the buried insulator layer 106 and laterally surrounds an active region 112 in the semiconductor layer 108, so as to electrically isolate the active region 112 from other portions of the semiconductor layer 108 (e.g., other active regions).

In one embodiment, the active region 112 includes a single crystalline semiconductor material, such as silicon, germanium, a silicon-germanium alloy, a silicon-carbon alloy, a silicon-germanium-carbon alloy, gallium arsenide, indium arsenide, indium phosphide, a III-V compound semiconductor material, a II-VI compound semiconductor material, or an organic semiconductor material. In this embodiment, the semiconductor material includes silicon. The active region 112 of this embodiment is doped with a n-type dopant (e.g., arsenic, phosphorus, or the like). Non-electrical stress-generating dopants, such as germanium and carbon may also be present.

Figure 2:
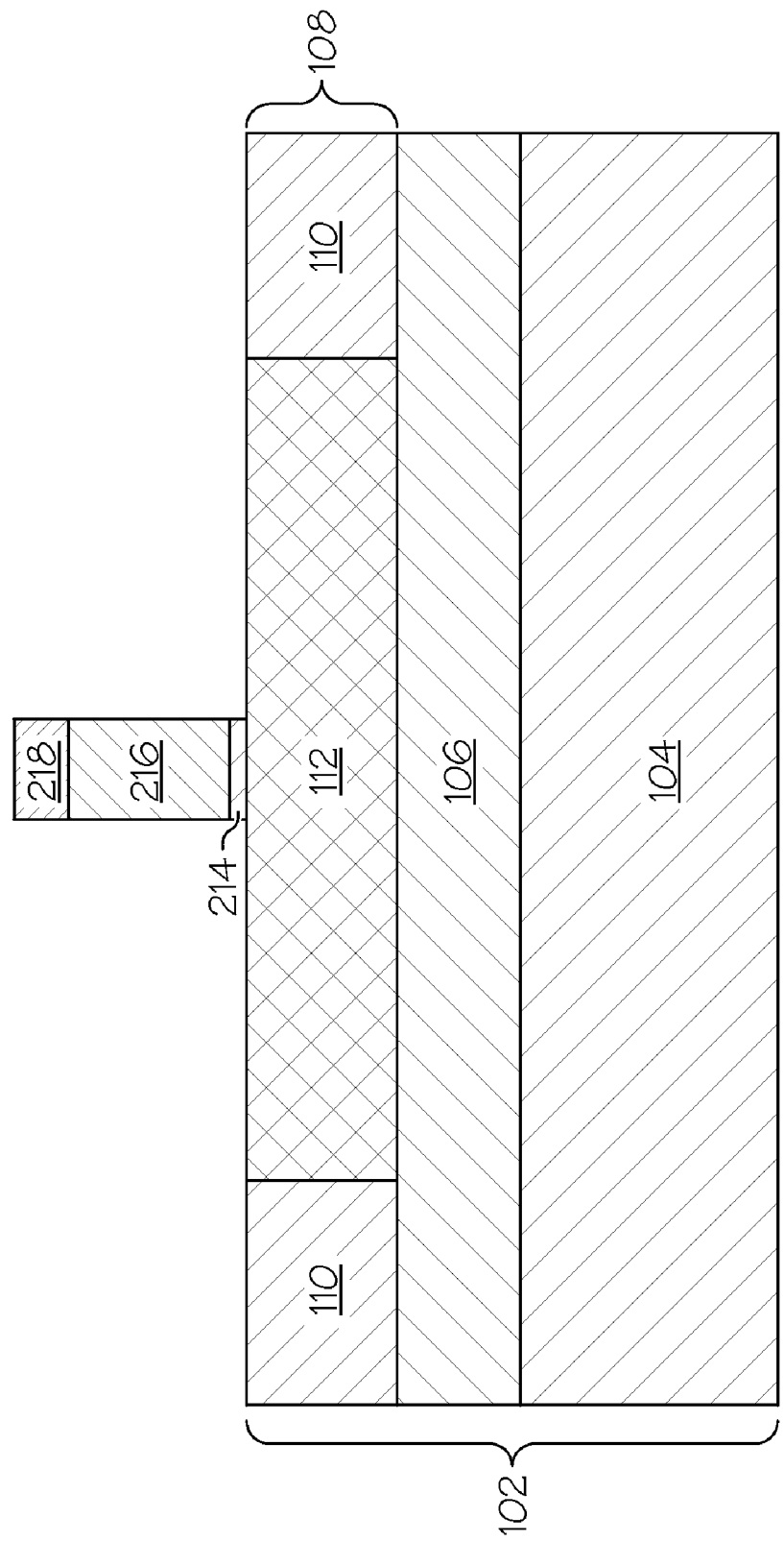

As shown in FIG. 2, a gate dielectric 214 and a gate conductor 216 are formed on the active region 112. More specifically, a stack of a gate dielectric layer and a gate conductor layer are formed on the active region 112. This stack is then lithographically patterned and etched to form the gate dielectric 214 and the overlying gate conductor 216 in a portion of the active region 112 of the semiconductor layer 108.

The gate dielectric 214 of this embodiment includes a conventional dielectric material (such as silicon oxide, silicon nitride, silicon oxynitride, or a stack thereof) that is formed by thermal conversion of a top portion of the active region 112 and/or by chemical vapor deposition ("CVD"). In alternative embodiments, the gate dielectric 214 includes a high-k dielectric material (such as hafnium oxide, zirconium oxide, lanthanum oxide, aluminum oxide, titanium dioxide, strontium titanate, lanthanum aluminate, yttrium oxide, an alloy thereof, or a silicate thereof) that is formed in a known manner (such as by CVD, atomic layer deposition ("ALD"), molecular beam epitaxy ("MBE"), pulsed laser deposition ("PLD"), liquid source misted chemical deposition ("LSMCD"), or physical vapor deposition ("PVD")).

The gate conductor 216 includes a semiconductor (e.g., polysilicon) gate layer and/or a metal gate layer. In one embodiment in which of the gate dielectric 214 includes a conventional dielectric material, the gate conductor 216 is a semiconductor gate layer. In one embodiment in which the gate dielectric includes a high-k dielectric material, the gate conductor 216 is a metal gate layer abutting the gate dielectric 214 and including a conductive refractory metal nitride (such as TaN, TiN, WN, TiAlN, TaCN, or an alloy thereof). In another embodiment, the gate conductor 216 includes a stack of a metal gate layer and a semiconductor gate layer. Also, a gate polysilicon cap 218 can be deposited on the gate conductor layer 216, such as through laser pulse chemical vapor deposition (LPCVD) or silicon sputtering.

Figure 3:
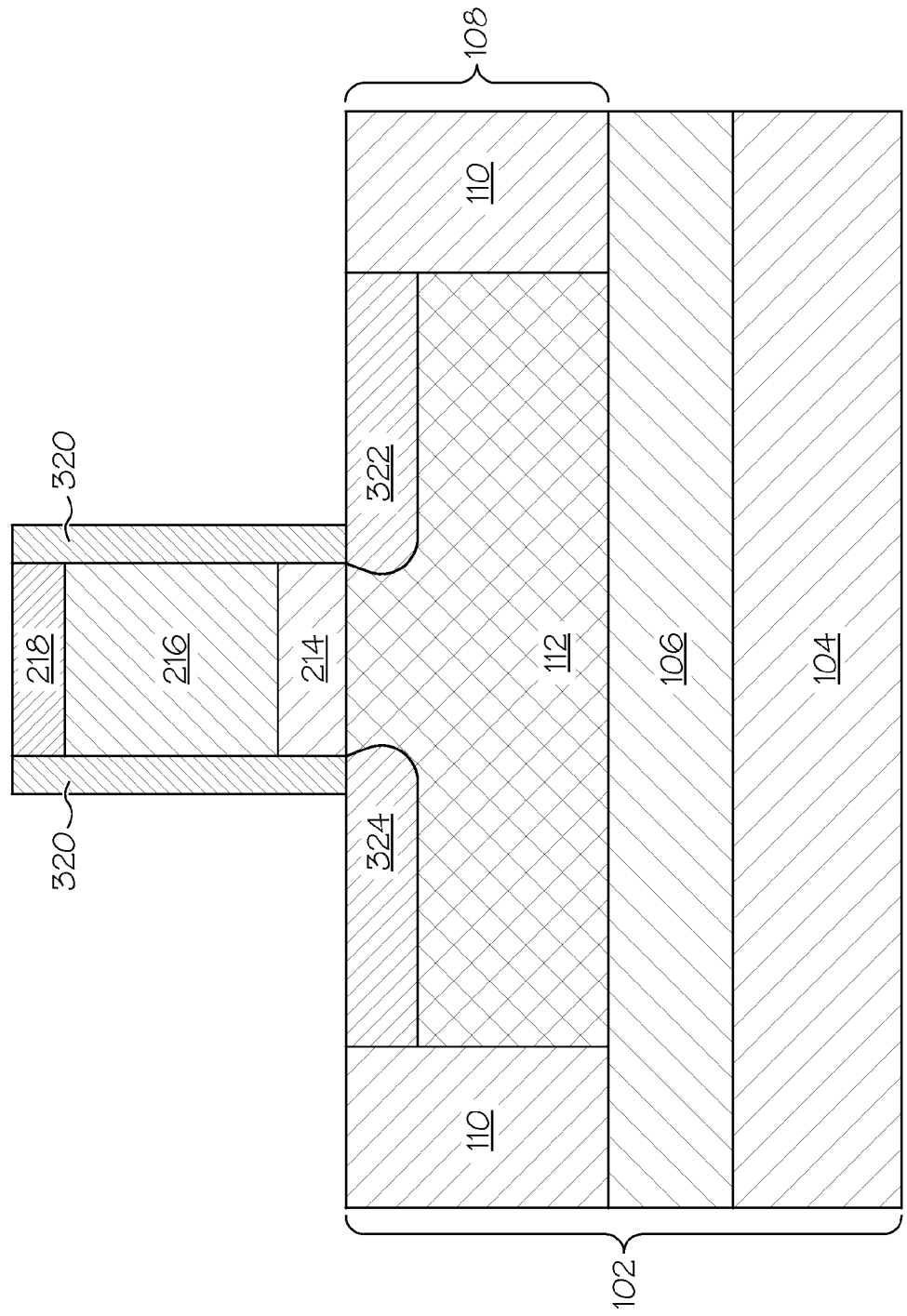

As shown in FIG. 3, a first gate spacer layer 320 including a dielectric material (such as silicon oxide) is then formed on the gate conductor 216 and on the semiconductor layer 108. Alternatively, a reactive-ion etch process can be used to remove the dielectric material on top of the gate and on the semiconductor layer to form a gate spacer only on the sidewall of the gate conductor 216. Ion implantations are performed into the semiconductor layer 108 employing the gate conductor 216 as an implantation mask in order to form a source extension region 322 in a source region 326 and a drain extension region 324 in a drain region 328.

The source extension region 322 and the drain extension region 324 are formed in the semiconductor layer 108 at the same time. This ion implantation to form the extension regions can be performed before or after the formation of the first gate spacer layer 320, or alternatively formation of the first gate spacer layer 320 can be omitted. If the ion implantation follows formation of the first gate spacer layer 320, the vertical portions of the first gate spacer layer 320 on the sidewalls of the gate conductor 214, 216, 218 also serve as an implantation mask.

Figure 4:
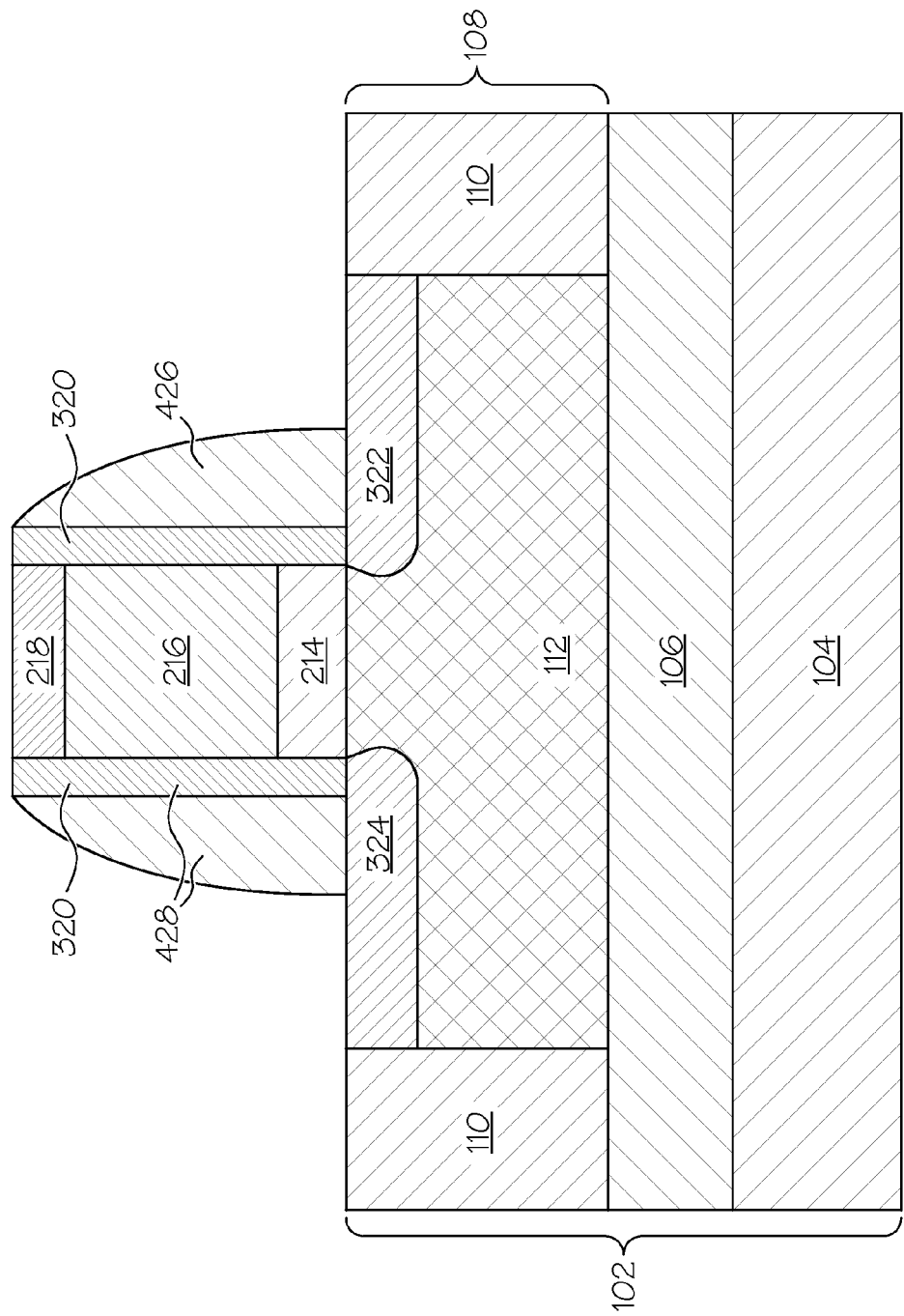

As shown in FIG. 4, a second gate spacer layer 426 is deposited on the first gate spacer layer 320, and then these two layers are etched (e.g., using reactive ion etching) to form a gate spacer 428. This gate spacer 428 includes the combination of the first gate spacer layer portion 320 and the second gate spacer layer portion 426. In exemplary embodiments, the second gate spacer layer portion 426 includes a dielectric material that is the same as or different than the dielectric material of the first gate spacer layer portion 54. For example, in this embodiment the first gate spacer layer portion 320 includes silicon oxide and the second gate spacer layer portion 426 includes silicon nitride. The dielectric materials for the first and second gate spacer layer portions may include low-k dielectric materials. The portion of the first gate spacer layer 320 outside the outer sidewalls of the second gate spacer layer portion 426 is removed during the reactive ion etching. Thus, the gate spacer 428 laterally abuts the sidewalls of the gate conductor 216 and the gate dielectric 214, and abuts the source extension region 322 and the drain extension region 324.

Figure 5:
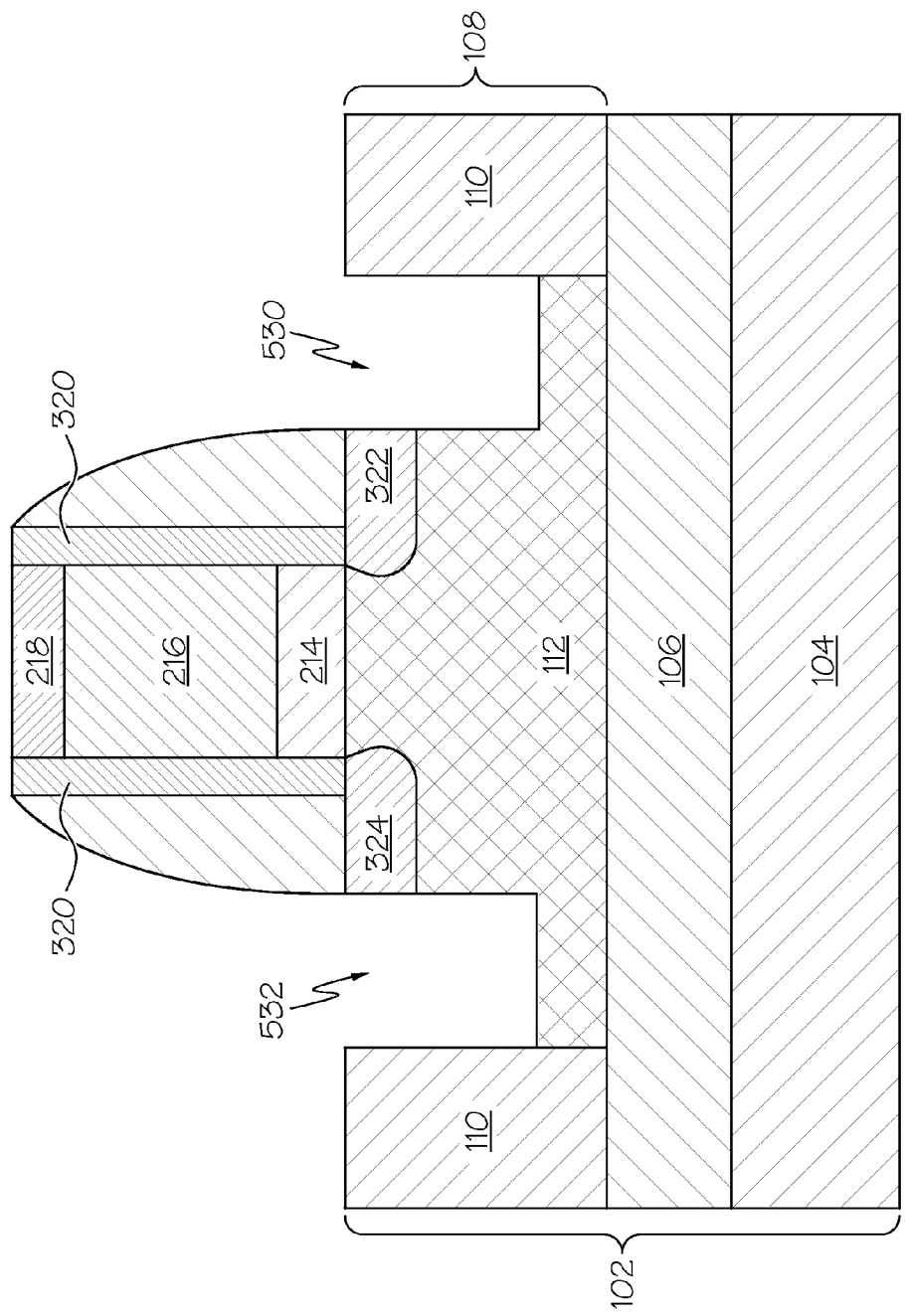
Figure 6:
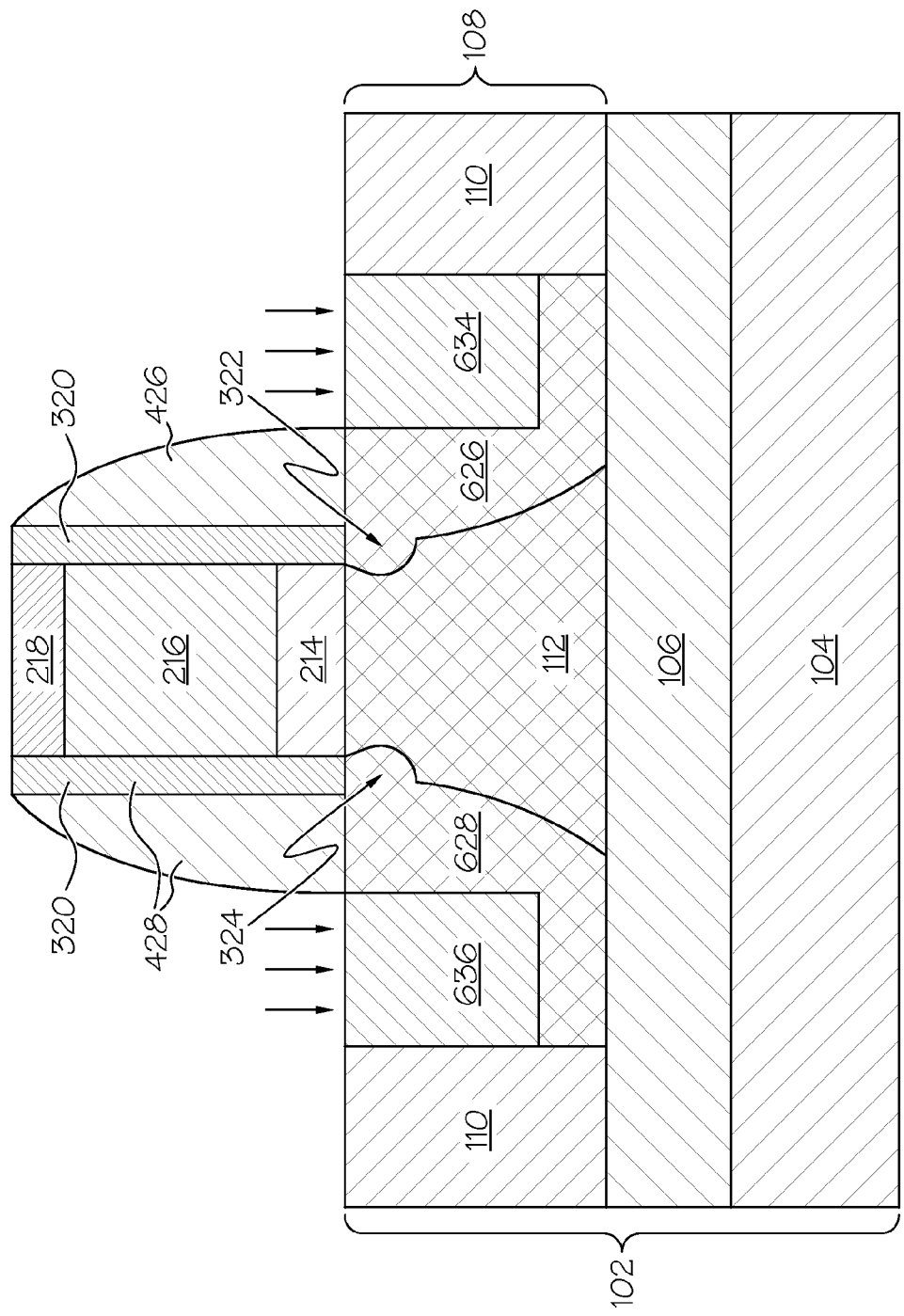

Trenches 530, 532 are then lithographically patterned, for example by reactive ion etching (RIE), into the active region 112 between the shallow trench isolation regions 110 and the gate spacer 428 as shown in FIG. 5 Embedded SiGe regions 634, 636 are then created in these trenches 532, 534, as shown in FIG. 6. In particular, the embedded SiGe 634, 636 can be formed in the trenches 530, 532 by epitaxially growing the SiGe from the silicon exposed within the trenches 530, 532.

In one embodiment, the process of epitaxially growing the SiGe includes a selective epitaxy process, which grows silicon germanium on the exposed silicon surface within the active layer 112, but does not grow silicon germanium on dielectric layers, such as nitride or oxide. Also, this epitaxial process can be performed in the presence of an appropriate dopant impurity (such as in situ doping of boron), such that the SiGe grows with the dopant included therein, without there being a need to implant additional dopants later in subsequent processing. It should be noted that any appropriate impurity and not just boron can be used.

Figure 7:
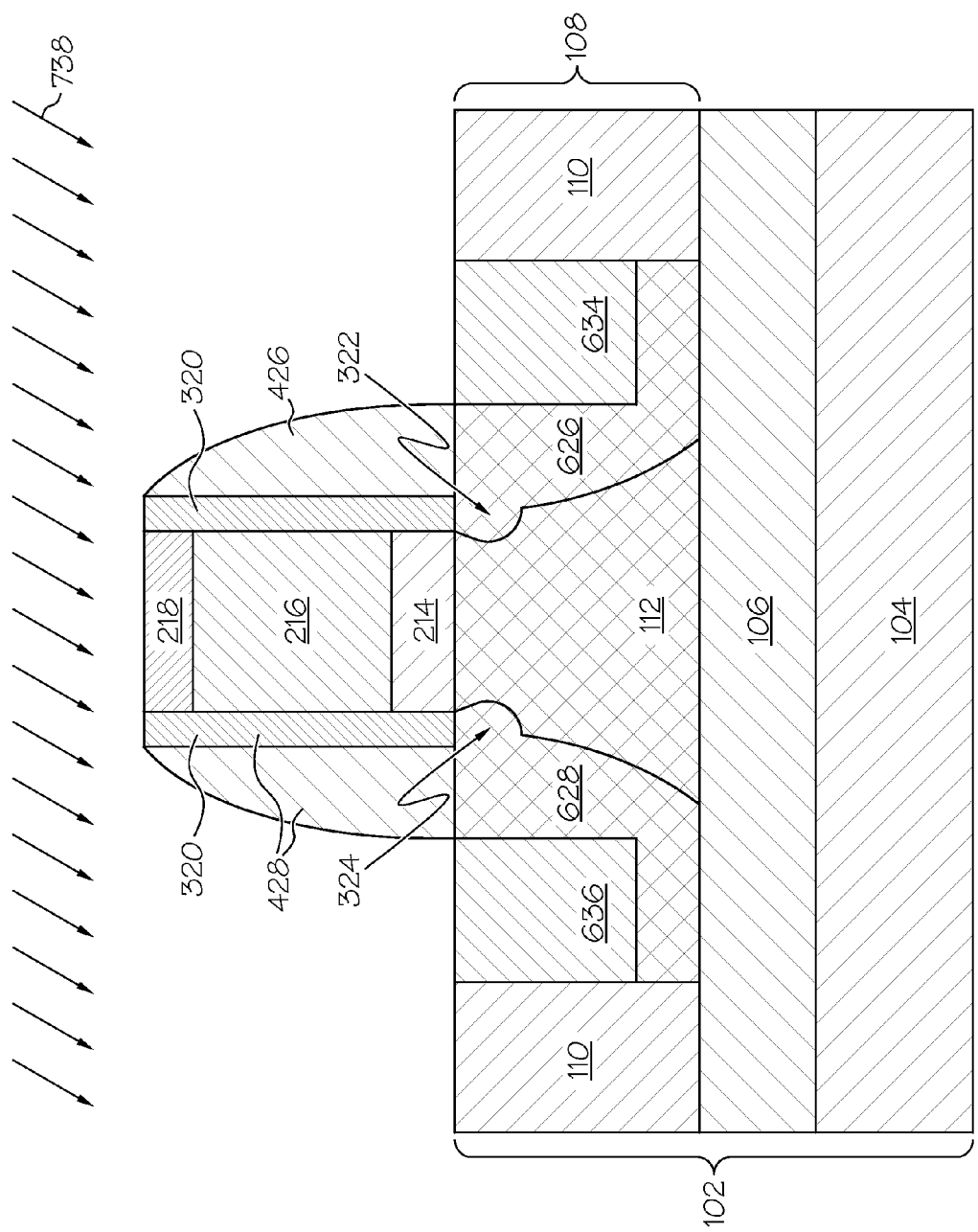
FIG. 7 shows a cross-sectional view of a fabrication process using an angled implantation process for source/drain implantation where the source side is fully exposed to the angled implantation and the drain side is shadowed/masked from the angled implantation process according to one embodiment of the present invention.

Next, vertical implantation is performed for defining source/drain regions within the PFET portion of the substrate 102 and for defining a PFET device channel. After the source/drain regions are created, an angled implantation process, as shown in FIG. 7 by the angled arrows 738, is performed to obtain an asymmetric implantation result. In particular, an asymmetric implant of an amorphizing species such as, but not limited to, Xenon ("Xe"), Argon, ("Ar"), or Germanium ("Ge") is performed to amorphize the source to body sidewall of the device. This increases the body to source leakage, which in turn reduces the floating body effect experienced by the device.

Figure 8:
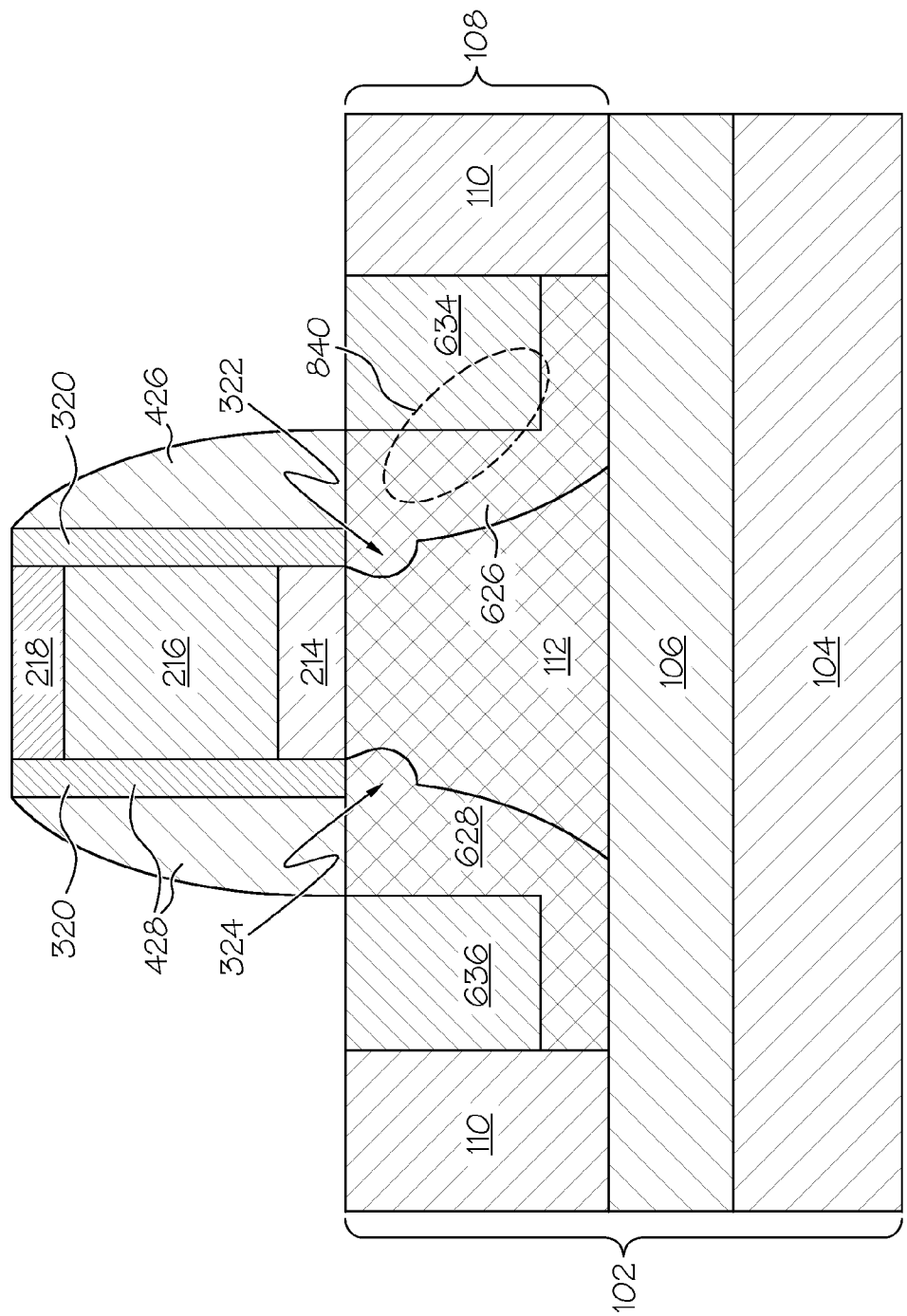
FIG. 8 shows a cross-sectional view of an asymmetric eSiGe PFET after the fabrication process of FIG. 7 according to one embodiment of the present invention.

The implantation process is carried out at an angle of about 0 to about 90 degrees, and in one embodiment the angle is substantially between 10 and 45 degrees, and in one embodiment the angle is about 20 degrees with respect to a normal axis of the substrate 102. This results in an asymmetric implant structure with respect to the source and drain regions of the device. FIG. 8 shows that implantation region 840 is formed within the active layer 112. However, because the gate spacer 428 shadows the implantation process with respect to the drain region 628 while the source region 626 is fully exposed to the implantation process, this process results in creating the implantation region 840 with substantially no implantation region in the embedded SiGe 636 about the drain region 628, resulting in the implantation region 840 being asymmetric.

In particular, the implantation region 840 on the source side of the device is shown extending into the embedded SiGe 634 and possibly slightly beneath the spacer 428. Therefore, because the implantation region 840 is in the source side, the source side of the PFET has a higher source to body leakage as compared to the drain side, which reduces the floating body effect experienced by the device.

Next, a source silicide contact 802 and a drain silicide contact 804 are formed by metallization of exposed semiconductor material. In particular, in this embodiment, a metal layer is deposited directly on the semiconductor layer 108 (such as by a blanket deposition). An anneal is then performed to form silicide. The metal is selectively removed leaving the silicide untouched (e.g., through an aqua regia wet etch). In this embodiment, the metal includes any of nickel, cobalt, titanium, or platinum. After the metal contact areas are formed, the device is completed in a conventional manner and electrical connections are made between the metal contact areas and other devices so as to form an integrated circuit.

Figure 9:
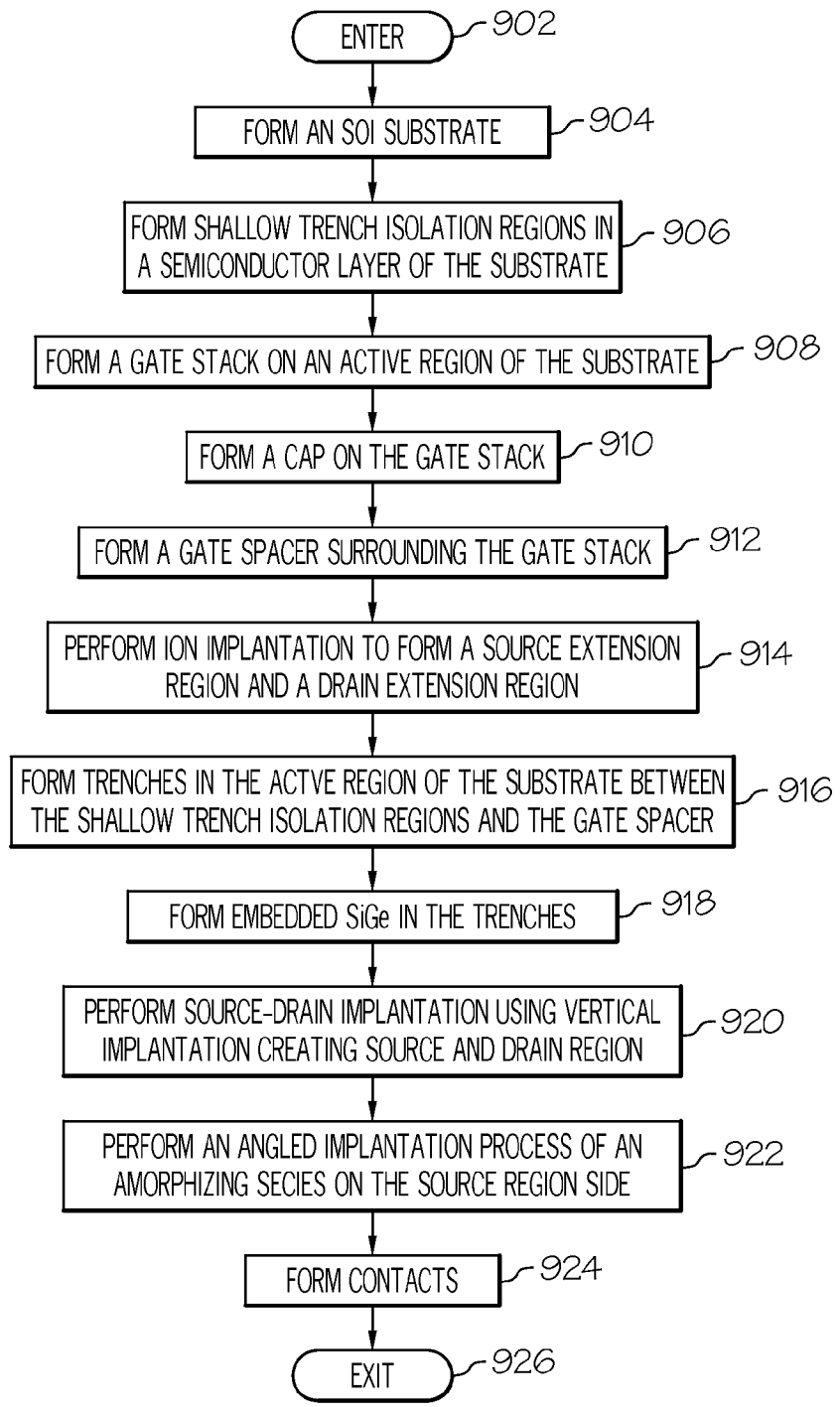
FIG. 9 is an operational flow diagram illustrating one process of fabricating an asymmetric eSiGe PFET according to one embodiment of the present invention.

FIG. 9 is an operational flow diagram illustrating one process for fabricating an asymmetric eSiGe PFET according to one embodiment of the present invention. The operational flow diagram begins at step 92 and flows directly into step 904. A SOI substrate 102, at step 904, is formed. The SOI substrate 102 is formed by a handle substrate 104, an overlying buried insulator layer 106, and an overlying semiconductor layer 108. Shallow trench isolation regions 110, at step 906, are formed in the semiconductor layer 108.

A gate stack 214, 216, at step 908, is formed on an active region 112 of the semiconductor layer 108. More specifically, a stack of a gate dielectric layer 214 and a gate conductor layer 216 are formed on the active region 112. A gate cap 218, at step 910, is then formed on the gate conductor layer 216 of the gate stack. A gate spacer 428, at step 912, is then formed on the gate stack 214, 216 and on the semiconductor layer 108. Ion implantation, at step 914, is performed to form source and drain extension regions 322, 324 in the semiconductor layer 108.

Trenches 530, 532, at step 916, are formed in the active region 112 between the shallow trench isolation regions 110 and the gate spacer 428. Embedded SiGe, at step 918, is then epitaxially grown within the trenches 530, 532. Source/drain implantation, at step 920, is performed using a vertical implantation process. At step 922, an angled implantation process is used resulting in an asymmetric implantation structure with respect to the source 626 and drain 628 regions of the device. In one embodiment, the gate spacer 428 shadows the angled implantation process with respect to the drain region 628 while the source region 626 is fully exposed to the angled implantation process resulting in the implantation region 840 in the source region 626 being asymmetric relative to a lack of implantation region in the drain region 628. In particular, the implantation region 840 on the source side 626 of the device extends into the embedded SiGe 634 and possibly slightly beneath the spacer 428. On the other side of the device, there is a lack of implantation region in the corresponding drain side 628 of the device. Contacts (not shown), at step 924, are then formed on the device. The control flow then exits at step 926.

It should be noted that some features of the present invention may be used in an embodiment thereof without use of other features of the present invention. As such, the foregoing description should be considered as merely illustrative of the principles, teachings, and example embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The integrated circuit can include a circuit supporting substrate with a one or more semiconductor devices disposed thereon. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips.

The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method for fabricating a semiconductor device, the method comprising:

forming a gate stack on an active region of a silicon-on-insulator substrate;

forming a gate spacer over the gate stack;
forming a first trench in a first portion of a semiconductor layer comprising the active region extending away from a first side of the gate spacer and a second trench in a second portion of the semiconductor layer extending away from a second side of the gate spacer;
epitaxially growing silicon germanium within the first trench and the second trench;
performing, after epitaxially growing the silicon germanium, a vertical implantation process, wherein performing the vertical implantation process defines
 a source region in the silicon germanium grown in the first trench,
 a drain region in the silicon germanium grown in the second trench, and
 a device channel; and
asymmetrically implanting an amorphizing species within the silicon germanium grown in the first trench comprising the source region relative to the silicon germanium grown in the second trench comprising the drain region, wherein the asymmetrically implanting forms an implantation region in the source region that extends into the silicon germanium and which is asymmetrical relative to the drain region, and
wherein the asymmetrically implanting further comprises:
 forming the angled implantation region of the source region at least partially under the gate spacer and without contacting the device channel.

2. The method of claim 1, wherein the active region is doped with an n-type dopant.

3. The method of claim 1, wherein the source region comprises a higher source-to-body leakage than the drain region.

4. The method of claim 1, wherein the asymmetrically implanting an amorphizing species is performed at an angle substantially between 0 and 90 degrees.

5. The method of claim 1, wherein the amorphizing species comprises any one of:
 Xenon;
 Argon; and
 Germanium.

6. The method of claim 1, wherein the asymmetrically implanting an amorphizing species damages the source region to a body sidewall.

7. The method of claim 1, wherein the gate stack including the spacer masks at least a portion of the silicon germanium grown in the second trench from the asymmetric implantation of the amorphizing species.

8. A semiconductor device comprising:
a gate stack formed on an active region of a silicon-on-insulator substrate;
a gate spacer formed over the gate stack;
a vertically implanted source region formed within the semiconductor layer comprising embedded silicon germanium; and
a vertically implanted drain region formed within the semiconductor layer comprising embedded silicon germanium, wherein the source region comprises and angled implantation region that is asymmetric relative to the drain region, and wherein the angled implantation region of the source region extends into the embedded silicon germanium region of the source region, wherein the angled implantation region only extends partially under the gate spacer.

9. The semiconductor device of claim 8, wherein the source region and the drain region are formed by asymmetrically implanting an amorphizing species within the embedded silicon germanium of the source region.

10. The semiconductor device of claim 9, wherein the gate stack masks at least a portion of the embedded silicon germanium of the drain region from the asymmetric implantation of the amorphizing species.

11. The semiconductor device of claim 9, wherein the amorphizing species comprises any one of:
 Xenon;
 Argon; and
 Germanium.

12. The semiconductor device of claim 8, wherein the active region is doped with an n-type dopant.

13. The semiconductor device of claim 8, wherein the source region comprises a higher source-to-body leakage than the drain region.

14. An integrated circuit comprising:
a circuit supporting substrate; and
a plurality of semiconductor devices disposed thereon, wherein each semiconductor device comprises:
 a gate stack formed on an active region of a silicon-on-insulator substrate;
 a gate spacer formed over the gate stack;
 a vertically implanted source region formed within the semiconductor layer comprising embedded silicon germanium; and
 a vertically implanted drain region formed within the semiconductor layer comprising embedded silicon germanium, wherein the source region comprises and angled implantation region that is asymmetric relative to the drain region, and wherein the angled implantation region of the source region extends into the embedded silicon germanium region of the source region, wherein the angled implantation region is formed at least partially under the gate spacer and without contacting a device channel formed below the gate stack.

15. The integrated circuit of claim 14, wherein the source region and the drain region are formed by asymmetrically implanting an amorphizing species within the embedded silicon germanium of the source region.

16. The integrated circuit of claim 15, wherein the gate stack masks at least a portion of the embedded silicon germanium of the drain region from the asymmetric implantation of the amorphizing species.

17. The integrated circuit of claim 15, wherein the amorphizing species comprises any one of:
 Xenon;
 Argon; and
 Germanium.

18. The integrated circuit of claim 14, wherein the active region is doped with an n-type dopant.

19. The integrated circuit of claim 14, wherein the source region comprises a higher source-to-body leakage than the drain region.

* * * * *